United States Patent
Saitoh

(10) Patent No.: US 8,232,821 B2
(45) Date of Patent: Jul. 31, 2012

(54) CLOCK DATA RECOVERY CIRCUIT

(75) Inventor: Shinichi Saitoh, Kyoto (JP)

(73) Assignee: Rohm Co., Ltd. (JP)

( * ) Notice: Subject to any disclaimer, the term of this patent is extended or adjusted under 35 U.S.C. 154(b) by 56 days.

(21) Appl. No.: 12/957,523

(22) Filed: Dec. 1, 2010

(65) Prior Publication Data

US 2012/0062291 A1    Mar. 15, 2012

(30) Foreign Application Priority Data

Dec. 4, 2009   (JP) ................................ 2009-276873

(51) Int. Cl.
*H03L 7/06* (2006.01)

(52) U.S. Cl. ........................................ 327/156; 327/12

(58) Field of Classification Search .................. None
See application file for complete search history.

(56) References Cited

U.S. PATENT DOCUMENTS

| 7,474,720 B2* | 1/2009 | Yuuki et al. | 375/354 |
| 7,970,092 B2* | 6/2011 | Arima et al. | 375/376 |
| 2006/0050828 A1* | 3/2006 | Otomo et al. | 375/375 |
| 2008/0143396 A1* | 6/2008 | Nishida | 327/146 |

FOREIGN PATENT DOCUMENTS

| JP | 2003-204319 A | 7/2003 |
| JP | 2005-5999 A | 1/2005 |

* cited by examiner

*Primary Examiner* — Cassandra Cox
(74) *Attorney, Agent, or Firm* — Cantor Colburn LLP

(57) ABSTRACT

Multiple flip-flops each latch input data at a time point of the corresponding clock signal. The i-th (i represents an integer) first logical gate generates an internal up signal which is asserted when the output of the $(2 \times i-1)$-th flip-flop does not match the output of the $(2 \times i)$-th flip-flop. The j-th (j represents an integer) second logical gate generates an internal down signal which is asserted when the output of the $(2 \times j)$-th flip-flop does not match the output of the $(2 \times j+1)$-th flip-flop. A third logical gate generates an up signal based upon the multiple internal up signals. A fourth logical gate generates a down signal based upon the multiple internal down signals.

14 Claims, 8 Drawing Sheets

CLOCK DATA RECOVERY CIRCUIT

BACKGROUND OF THE INVENTION

1. Field of the Invention

The present invention relates to a CDR (Clock Data Recovery) circuit.

2. Description of the Related Art

In order to transmit and receive data between semiconductor integrated circuits via a small number of data transmission lines, a serial data transmission is employed. In reception of such a serial data signal, each bit data of the serial data is latched at a time point of a clock signal that is in synchronization with the serial data.

In some cases, a clock signal is embedded in the serial data signal. In this case, each transition point of the serial data is monitored by means of a CDR circuit, the clock signal is reproduced based upon the transition points thus detected, and the serial data signal is latched according to the clock signal thus reproduced. Related arts are disclosed in Patent documents 1 and 2.

RELATED ART DOCUMENTS

Patent Documents

[Patent document 1]
Japanese Patent Application Laid Open No. 2005-5999
[Patent document 2]
Japanese Patent Application Laid Open No. 2003-204319

There are two kinds of serial data transmission methods, i.e., the so-called full-rate and half-rate methods. With the half-rate transmission method, the CDR circuit generates N-phase clock signals having a frequency half the transmission data rate and having phases that are shifted by (360°/N) from one another. Here, N represents an integer of 4 or more.

For example, with conventional arrangements, an up signal and a down signal are generated based upon the result of whether or not a sampled value obtained by sampling the serial data signal using a first phase clock signal matches a sampled value obtained by sampling the serial data using a second phase clock signal, and the frequency of the N-phase clock signals are subjected to a feedback control operation according to the up signal and the down signal thus generated. However, with such a method, the phase difference between data signals is output as a signal. Accordingly, with such an arrangement, such an up signal or down signal is asserted for a period of time that is unrelated to the number of times the value of the data consecutively transits.

With the technique disclosed in Patent document 1, the sampled data is temporarily held or latched by means of a flip-flop or a latch circuit so as to perform timing synchronization, and an up signal and a down signal are generated after the data change is compared. However, with such a method, a delay is applied to the up signal and the down signal. This leads to a problem of a reduction in the response speed of the circuit, resulting in a problem of reduced responsiveness to input data jitter.

SUMMARY OF THE INVENTION

The present invention has been made in view of such a situation. Accordingly, it is an exemplary purpose of an embodiment of the present invention to provide a clock data recovery circuit which is capable of handling jitter with high-speed responsiveness.

An embodiment of the present invention relates to a clock data recovery circuit. The clock data recovery circuit comprises: a voltage controlled oscillator configured to generate multi-phase clock signals including multiple clock signals, each having a frequency that corresponds to an input control voltage, and having phases shifted from one another such that they are positioned at regular intervals; a phase comparator configured to compare the phase of input data with the respective phases of the multiple clock signals, and to generate a phase difference signal, including an up signal and a down signal, which represents the comparison result; and a charge pump circuit configured to generate the control voltage such that, when the up signal of the phase difference signal is asserted, the frequency of the voltage controlled oscillator is raised, and when the down signal of the phase difference signal is asserted, the frequency of the voltage controlled oscillator is lowered. The phase comparator comprises multiple flip-flops, multiple second logical gates, a third logical gate, and a fourth logical gate.

The multiple flip-flops are severally arranged for the multiple clock signals, and each configured to latch the input data at a time point of a corresponding clock signal. The multiple first logical gates are severally arranged for the odd-numbered flip-flops. The i-th (i represents an integer) first logical gate is configured to generate an internal up signal which is asserted when an output signal of the $(2 \times i-1)$-th flip-flop does not match an output signal of the $(2 \times i)$-th flip-flop.

The multiple second logical gates are severally arranged for the even-numbered flip-flops. The j-th (j represents an integer) second logical gate is configured to generate an internal down signal which is asserted when an output signal of the $(2 \times j)$-th flip-flop does not match an output signal of the $(2 \times j+1)$-th flip-flop. The third logical gate is configured to generate the up signal based upon the multiple internal up signals generated by the multiple first logical gates. The fourth logical gate is configured to generate the down signal based upon the multiple internal down signals generated by the multiple second logical gates.

With such an embodiment, the up signal and the down signal that are proportional to change in data can be generated with little delay. Thus, such an arrangement is capable of suppressing jitter that occurs in the reproduced clock signal. Furthermore, such an arrangement provides improved responsiveness to jitter in the input clock signal.

Also, when all the internal up signals are asserted, the third logical gate may assert the up signal. Also, when all the internal down signal are asserted, the fourth logical gate may assert the down signal.

Also, the multiple clock signals may configured as four-phase clock signals.

Also, the multiple first logical gates and the multiple second logical gates may be each configured as an EOR (exclusive OR) gate. Also, the third logical gate and the fourth logical gate may be each configured as an AND (logical AND) gate.

Also, the voltage controlled oscillator may comprise: multiple differential delay circuits connected in the form of a ring, and each configured such that the delay amount is adjusted according to the control voltage; multiple comparators severally arranged for the multiple differential delay circuits, and each configured to convert a corresponding input differential signal into a single-ended internal clock signal; and a duty correction circuit configured to receive a pair of internal clock signals having phases that are shifted by 180 degrees from one another, to correct the duty ratio of each internal clock signal, and to output the pair of internal clock signals thus corrected.

With such an embodiment, after the duty ratio of the clock signal is corrected, the clock signal thus corrected is supplied to a flip-flop configured to perform phase comparison. Thus, such an arrangement provides high-precision phase comparison.

Also, the duty correction circuit may comprise: a first NAND (logical NAND) gate arranged such that the one of a pair of internal clock signals is input to a first input terminal thereof; a second NAND gate arranged such that the other of the pair of internal clock signals is input to a first input terminal thereof, a second input terminal thereof is connected to an output terminal of the first NAND gate, and an output terminal thereof is connected to a second input terminal of the first NAND gate; a third NAND gate arranged such that a first input terminal thereof is connected to the output terminal of the first NAND gate; and a fourth NAND gate arranged such that a first input terminal thereof is connected to the output terminal of the second NAND gate, a second input terminal thereof is connected to an output terminal of the third NAND gate, and an output terminal thereof is connected to a second input terminal of the third NAND gate.

Also, the duty correction circuit may comprise: a first PMOS (P-channel Metal Oxide Semiconductor) transistor, a first NMOS (N-channel Metal Oxide Semiconductor transistor), and a second NMOS transistor connected in series between a power supply terminal and a ground terminal; a second PMOS transistor, a third NMOS transistor, and a fourth NMOS transistor connected in series between the power supply terminal and the ground terminal; a third PMOS transistor, a fifth NMOS transistor, and a sixth NMOS transistor connected in series between the power supply terminal and the ground terminal; and a fourth PMOS transistor, a seventh NMOS transistor, and an eighth NMOS transistor connected in series between the power supply terminal and the ground terminal. Also, one of the pair of internal clock signals may be input to the gates of the first PMOS transistor and the second NMOS transistor. Also, the other of the pair of internal clock signals may be input to the gates of the second PMOS transistor and the fourth NMOS transistor. Also, a connection node that connects the first PMOS transistor and the first NMOS transistor may be connected to the gates of the third NMOS transistor, the third PMOS transistor, and the sixth NMOS transistor. Also, a connection node that connects the second PMOS transistor and the third NMOS transistor may be connected to the gates of the first NMOS transistor, the fourth PMOS transistor, and the eighth NMOS transistor. Also, a connection node that connects the third PMOS transistor and the fifth NMOS transistor may be connected to the gate of the seventh NMOS transistor and one of output terminals of the duty correction circuit. Also, a connection node that connects the fourth PMOS transistor and the seventh NMOS transistor may be connected to the gate of the fifth NMOS transistor and the other of the output terminals of the duty correction circuit.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
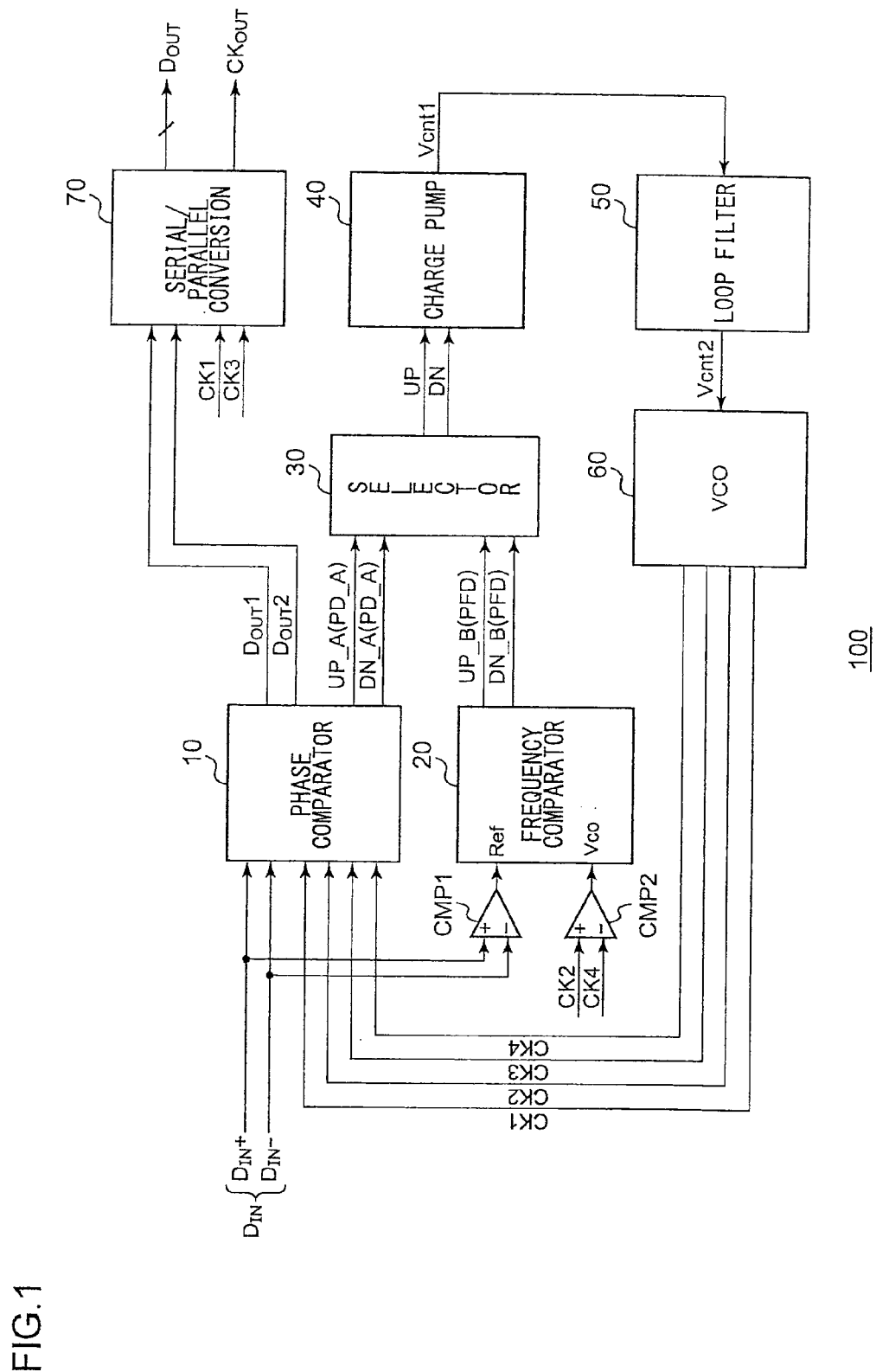
FIG. 1 is a block diagram which shows a configuration of a CDR circuit according to an embodiment.

FIG. 1 is a block diagram which shows a configuration of a CDR circuit 100 according to an embodiment. The CDR circuit 100 includes a phase comparator 10, a frequency comparator 20, a selector 30, a charge pump circuit 40, a loop filter 50, a VCO (Voltage Controlled Oscillator) 60, and a serial/parallel converter 70.

The CDR circuit 100 receive serial differential input data $D_{IN}+$ and $D_{IN}-$ (which will simply be referred to as the "input data $D_{IN}$" as necessary). The input data $D_{IN}$ includes an embedded clock signal. The CDR circuit 100 extracts the clock signal from the input data $D_{IN}$, reproduces the clock signal based upon the input data $D_{IN}$, and acquires the value of the input data $D_{IN}$ using the clock signal thus reproduced.

The CDR circuit 100 reproduces four-phase clock signals CK1 to CK4 having a frequency half the data rate. The four-phase clock signals CK1 through CK4 have phases that are shifted by a quarter period (90°) from one another. The four-phase clock signals CK1 through CK4 are generated by means of a so-called PLL circuit.

Figure 2:
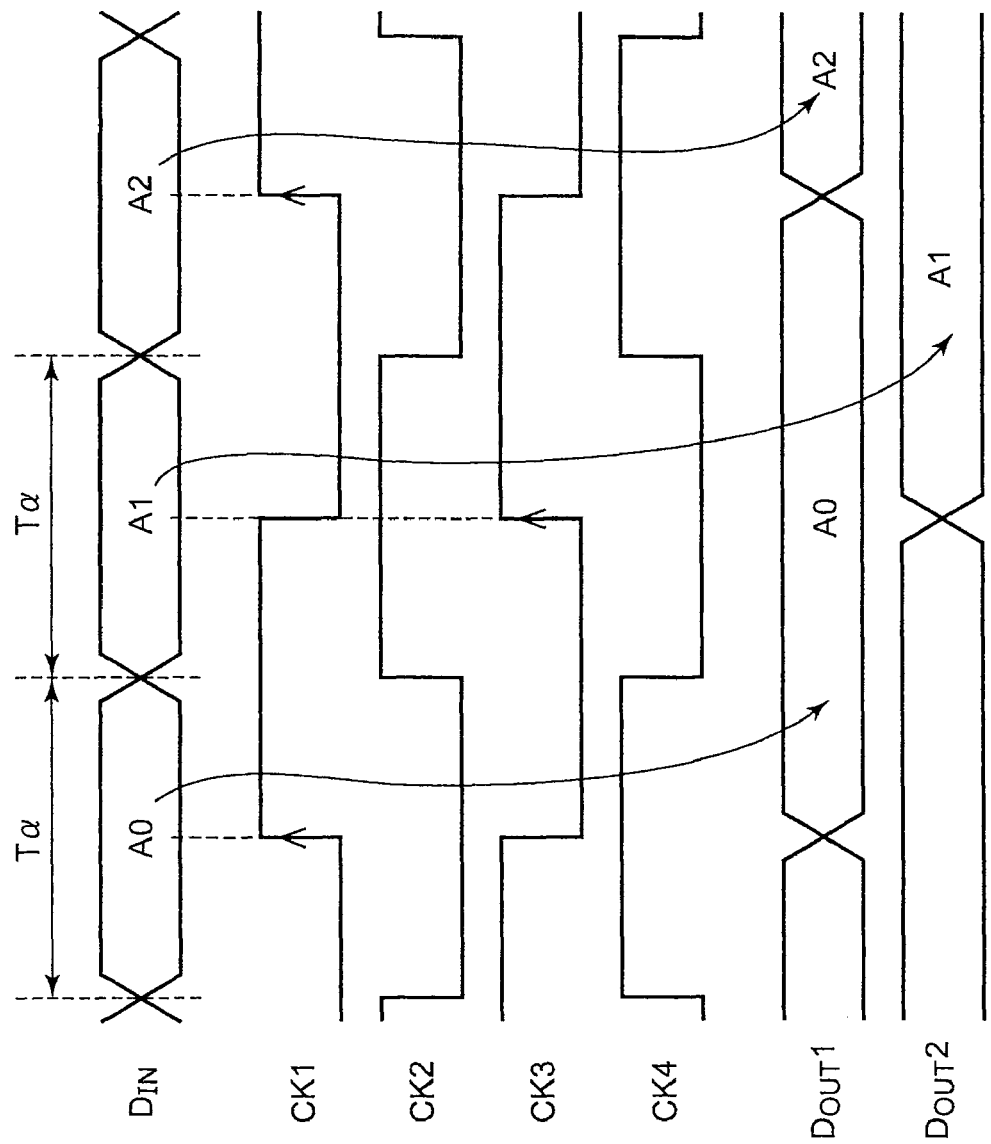
FIG. 2 is a time chart which shows the timing of each signal generated in the CDR circuit shown in FIG. 1.

The phase comparator 10 acquires two data signals $D_{out}1$ and $D_{out}2$ in increments of cycles of the clock signals, using the first clock signal CK1 and the third clock signal CK3 that have phases shifted by 180° from one another. The first clock signal CK1 and the third clock signal CK3 are clock signals from among the four-phase clock signals CK1 through CK4, Specifically, the value of the input data $D_{IN}$ is latched at a time point of each positive edge of the first clock signal CK1, and the value thus latched is acquired as the data $D_{out}1$. Furthermore, the value of the input data $D_{IN}$ is latched at a time point of each positive edge of the third clock signal CK3, and the value thus latched is acquired as the data $D_{OUT}2$. The data $D_{OUT}1$ and $D_{OUT}2$ are supplied to the serial/parallel converter 70 provided as a downstream component. FIG. 2 is a time chart which shows the time point of each signal in the CDR circuit 100 shown in FIG. 1.

The serial/parallel converter 70 receives the serial data $D_{OUT}1$ and $D_{OUT}2$ and the clock signals CK1 and CK3 that are in synchronization with the serial data $D_{OUT}1$ and $D_{OUT}2$, and adjusts the data timing such that the timings of the serial data $D_{OUT}1$ and $D_{OUT}2$ match each other, thereby converting the serial data $D_{OUT}1$ and $D_{OUT}2$ into output parallel data $D_{OUT}$. The serial/parallel converter 70 outputs the output parallel data $D_{OUT}$ to a downstream processing block, together with a clock signal CKOUT that is synchronization with the output parallel data $D_{OUT}$.

Description will be made below regarding a mechanism for extracting and reproducing the clock signals CK1 through CK4 employed in the CDR circuit 100.

The phase comparator 10, the charge pump circuit 40, the loop filter 50, and the VCO 60 form a so-called PLL (Phase Locked Loop) circuit. The PLL circuit performs a feedback control operation on the frequencies and phases of the clock signals CK1 through CK4 such that the edge timing of the second clock signal CK2 and the edge timing of the fourth clock signal CK4 each match the transition point of the input data $D_{IN}$.

The VCO 60 oscillates at a frequency that corresponds to an input control voltage Vcnt2. The VCO 60 generates four-phase clock signals CK1 through CK4. For example, the VCO 60 is configured as a ring oscillator having a configuration in which four stages of delay elements are connected in the form of a ring. Each delay element is biased by the control voltage Vcnt2, and the delay amount of each delay element is controlled according to the control voltage Vcnt2. As a result, the oscillation frequency of the ring oscillator is determined according to the control voltage Vcnt2. The four-phase clock signals CK1 through CK4 correspond to the respective input signals (or output signals) of the four delay elements.

The phase comparator 10 receives the input data $D_{IN}$ and the clock signals CK1 through CK4. The phase comparator 10 compares the phase of the input data $D_{IN}$ with the phase of each of the clock signals CK1 through CK4, and generates an up signal UP_A and a down signal DOWN_A. The up signal UP_A and the down signal DNA will also be referred to collectively as the "phase difference signal PD_A".

When the phase of the clock signal CK is delayed in comparison to the input data $D_{IN}$, the up signal UP_A is asserted (set to high level). When the phase of the clock signal CK is advanced in comparison to the input data $D_{IN}$, the down signal DN_A is asserted.

The phase difference signal PD_A is input to the charge pump circuit 40 via the selector 30. When the up signal UP_A is asserted, the charge pump circuit 40 raises the control voltage Vcnt1. When the down signal DN_A is asserted, the charge pump circuit 40 lowers the control voltage Vcnt1. The loop filter 50 is configured as a lag lead filter, which adjusts the high-frequency component of the control voltage Vcont1, and generates the control voltage Vcnt2. A low-pass filter may be employed as the loop filter 50.

The configuration of the charge pump circuit 40 is not restricted in particular. For example, the charge pump circuit 40 has a configuration including a capacitor, a charging circuit configured to charge the capacitor according to the up signal UP_A, and a discharging circuit configured to discharge the capacitor according to the down signal DNA. The control voltage Vcnt2 is output to the VCO 60.

When the phase of the clock signal CK is delayed and the up signal UP_A is asserted, the control voltage Vcnt2 is raised, thereby raising the frequency of the clock signal CK. As a result, a feedback operation is performed so as to advance the phase of the clock signal CK. Conversely, when the phase of the clock signal CK is advanced and the down signal DNA is asserted, the control voltage Vcnt2 is reduced, thereby reducing the frequency of the clock signal CK. Thus, a feedback operation is performed so as to delay the phase of the clock signal CK. As a result, such an arrangement optimizes the frequency and the phase of the clock signal CK with each transition point (edge) of the input data $D_{IN}$ as a reference.

In addition to the aforementioned PLL circuit, the CDR circuit 100 includes an FLL (Frequency Locked Loop) circuit comprising the frequency comparator 20, the charge pump circuit 40, the loop filter 50, and the VCO 60.

The frequencies and phases of the clock signals CK1 through CK4 are subjected to a feedback control operation by means of the FLL circuit such that the period of the clock signals CK2 and CK4 matches the data period Td of the input data $D_{IN}$. It should be noted that the loop of the FLL circuit may be eliminated.

A first comparator CMP1 makes a comparison between the input data $D_{IN}+$ and $D_{IN}-$, and generates a reference signal Ref. Furthermore, a second comparator CMP2 makes a comparison between the clock signals CK2 and CK4, and generates a Vco signal. The frequency comparator 20 makes a comparison between the reference signal Ref and the Vco signal, and generates a phase frequency difference signal PFD that corresponds to the phase difference. The phase frequency difference signal PFD indicates whether the phase of the Vco signal is advanced or delayed in comparison to the phase of the reference signal Ref. As with the phase difference signal PD, the phase frequency difference signal PFD includes an up signal UP_B and a down signal DN_B. When the phase of the Vco signal is delayed, the up signal UP_B is asserted. When the phase of the Vco signal is advanced, the down signal DN_B is asserted.

The phase frequency difference signal PFD is input to the charge pump circuit 40 via the selector 30. The charge pump circuit 40, the loop filter 50, and the VCO 60 each operate in the same way as described above. The selector 30 receives the phase difference signal PD and the phase frequency difference signal PFD, and generates a control signal (UP/DN).

The FLL circuit performs a feedback control operation on the frequencies and phases of the clock signals CK1 through CK4 such that the interval between each positive edge of the clock signal CK2 and the corresponding positive edge of the clock signal CK4 matches the period of the input of the input data $D_{IN}$.

Figure 3:
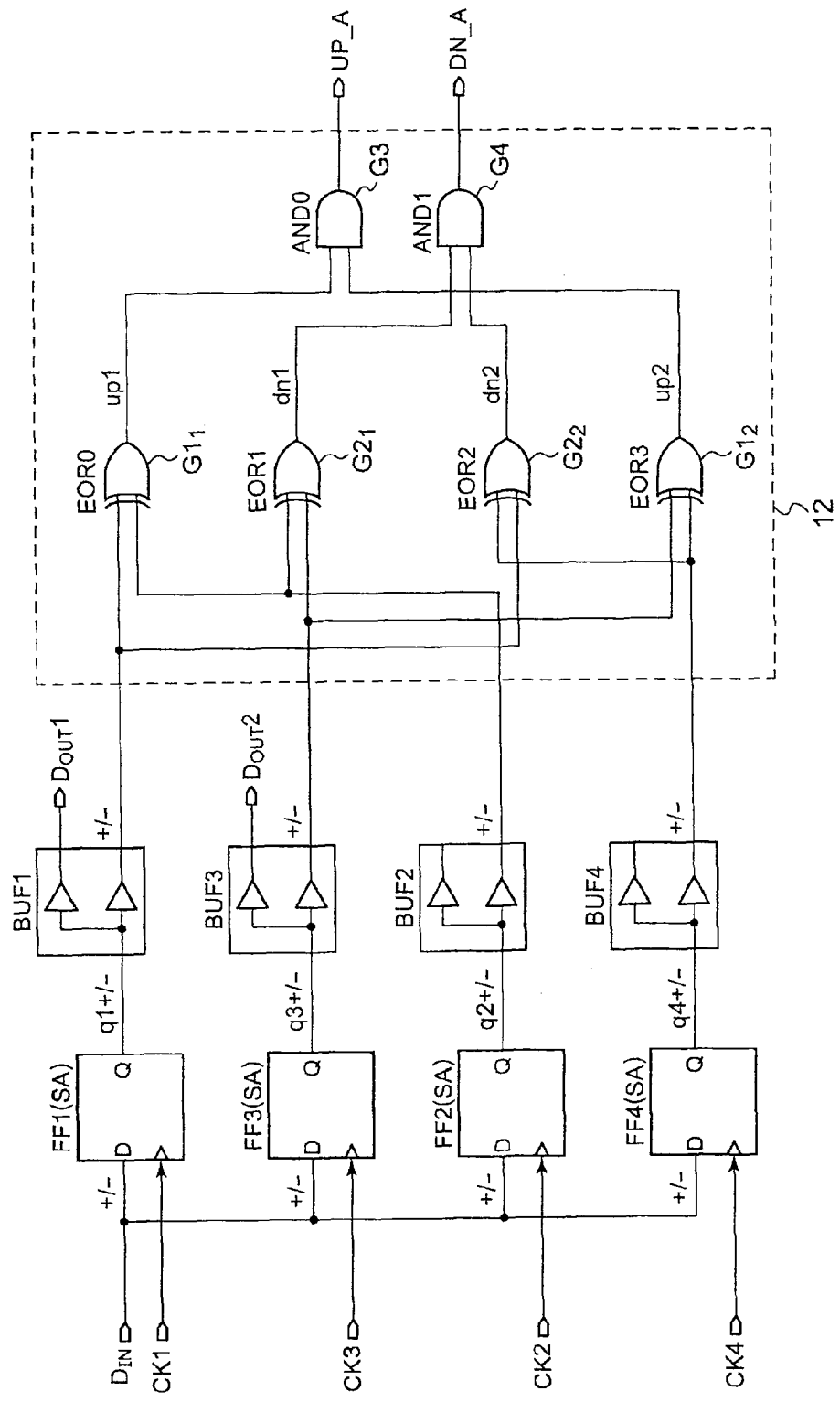
FIG. 3 is a circuit diagram which shows a configuration of a phase comparator shown in FIG. 1.

The above is the overall configuration of the CDR circuit 100. Next, description will be made regarding a specific configuration of the phase comparator 10. FIG. 3 is a circuit diagram which shows a configuration of the phase comparator 10 shown in FIG. 1. The phase comparator 10 includes flip-flops FF1 through FF4, buffers BUF1 through BUF4, and a decoder circuit 12.

The multiple flip-flops FF1 through FF4 are provided to the respective clock signals CK1 through CK4. The i-th flip-flop FFi ($1 \leq i \leq 4$) makes a comparison between the input signal $D_{IN}+$ and $D_{IN}-$ (i.e., single-ended conversion), and latches the data that indicates the comparison result at a positive edge timing of the corresponding clock signal CKi. Such a flip-flop will also be referred to as the "sense amplifier (SA)".

The data q1 thus latched by the flip-flop FF1 is output as data $D_{OUT}1$ via the buffer BUF1. In the same way, the data q3 latched by the flip-flop FF3 is output as data $D_{OUT}2$ via the buffer BUF3.

The data q1 through q4 generated by the respective flip-flops FF1 through FF4 are input to the decoder circuit 12 provided as a downstream circuit via the respective buffers BUF1 through BUF4. The decoder circuit 12 generates the phase difference signal PDA (up signal UP_A and down signal DN_A) based upon the data q1 through q4.

The decoder circuit 12 includes multiple first logical gates G1, multiple second logical gates G2, a third logical gate G3, and a fourth logical gate G4.

The multiple first logical gates $G1_1$ and $G1_2$ are provided to the odd-numbered flip-flops FF1 and FF3, respectively. In a case in which the phase number is greater than 4, it is assumed that FF1, FF3, FF5, and so on, each function as odd-numbered flip-flops. In other words, odd-numbered flip-flops are flip-flops that correspond to the clock signals used to latch the data $D_{OUT}1$ and $D_{OUT}2$, and the additional flip-flops that are arranged in an alternating manner.

The i-th (i represents an integer) first logical gate $G1_i$ is configured to generate an internal up signal upi which is asserted (set to high level) when the output of the (2×i−1)-th flip flop FF2×i−1 does not match the output of the (2×i)-th flip flop FF2×i.

The multiple second logical gates $G2_1$ through $G2_2$ are provided to the even-numbered flip-flops FF2 and FF4, respectively. In a case in which the phase number is greater than 4, it is assumed that FF2, FF4, FF6, and so on, each function as the even-numbered flip-flop.

The j-th (j represents an even number) second logical gate $G2_j$ is configured to generate an internal down signal dni which is asserted when the output of the (2×j)-th flip flop FF(2×j) does not match the output of the (2×j+1)-th flip flop.

For example, the first logical gate G1 and the second logical gate G2 can be configured employing an exclusive OR gate EOR.

Specifically, the logical gate EOR0 ($G1_1$) makes a comparison between the data q1 and q2, and generates an internal up signal up1 that indicates whether or not the data q1 match the data q2. The logical gate EOR1 ($G2_1$) makes a comparison between the data q2 and q3, and generates an internal down signal dn1 that indicates whether or not the data q2 match the data q3. The logical gate EOR2 ($G2_2$) makes a comparison between the data q4 and q1, and generates an internal down signal dn2 that indicates whether or not the data q4 match the data q1. The logical gate EOR3 ($G1_2$) makes a comparison between the data q3 and q4, and generates an internal up signal up2 that indicates whether or not the data q3 match the data q4. The logical gates EOR0 through EOR3 each generate an output signal which is set to 0 (low level) when the two input signals match, and which is set to 1 (high level) when the two input signals do not match.

The third logical gate G3 generates the up signal UP_A based upon the multiple internal up signals up1 and up2 thus generated by the multiple first logical gates $G1_1$ and $G1_2$. Specifically, the third logical gate G3 is configured as an AND gate. When all the internal up signals up1 and up2 are asserted, the third logical gate G3 asserts the up signal UP_A.

The fourth logical gate G4 (AND1) is configured as an AND gate, and generates the down signal DN_A based upon the multiple internal down signals dn1 and dn2 thus generated by the multiple second logical gates $G2_1$ and $G2_2$. Specifically, the fourth logical gate G4 is configured as an AND gate.

When all the down signals dn1 and dn2 are asserted, the fourth logical gate G4 asserts the down signal DN_A.

Figure 4B:
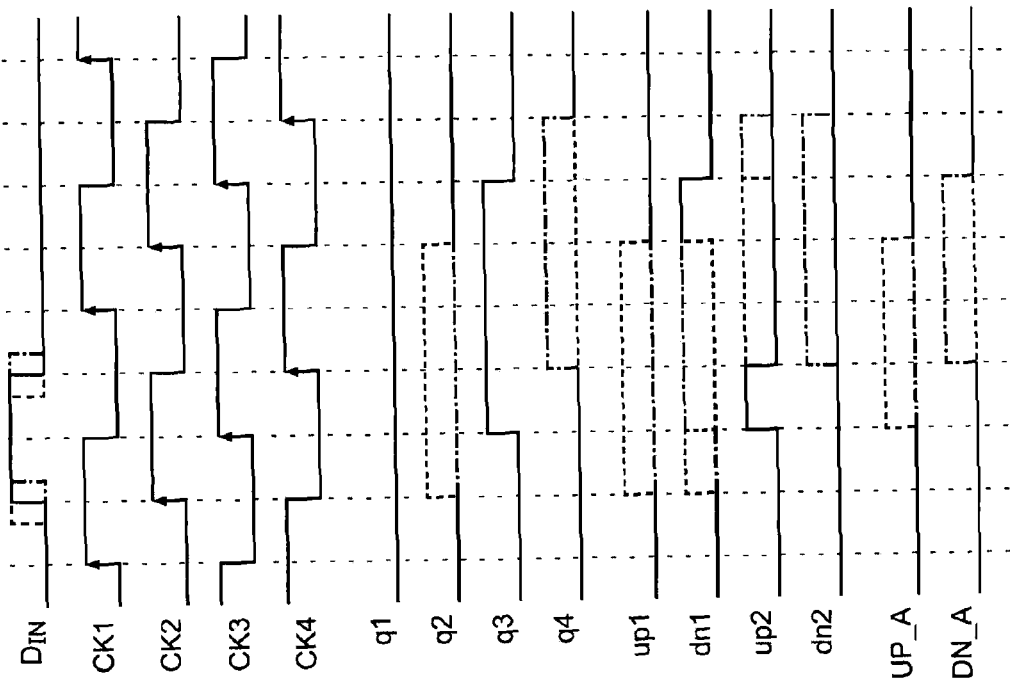
FIGS. 4A and 4B are time charts showing the operation of the phase comparator shown in FIG. 3.
Figure 4A:
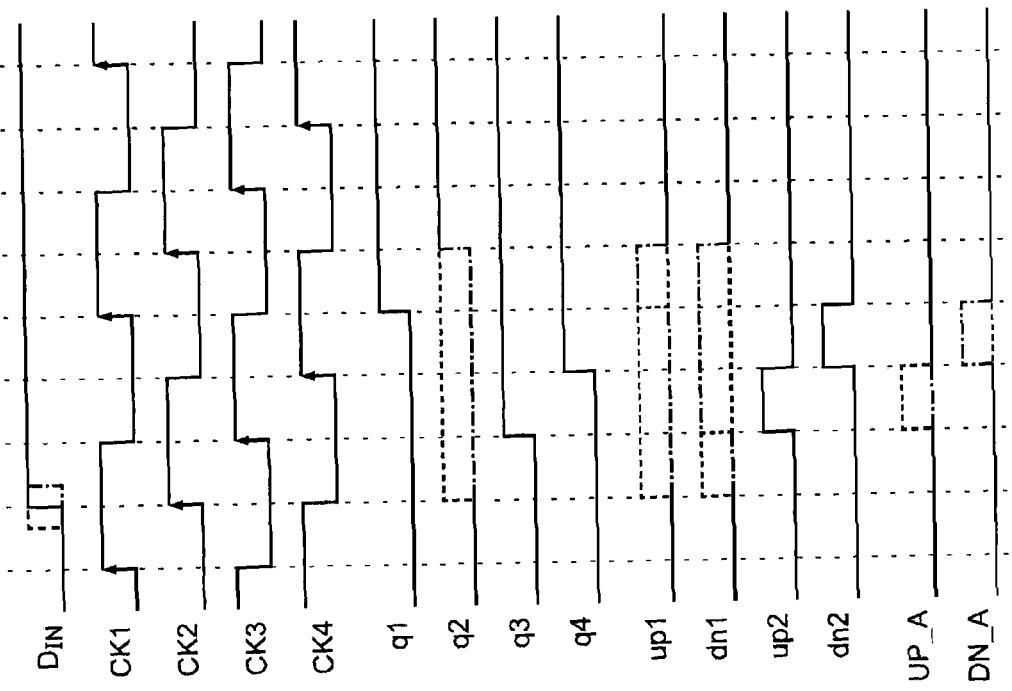
Figure 5A:
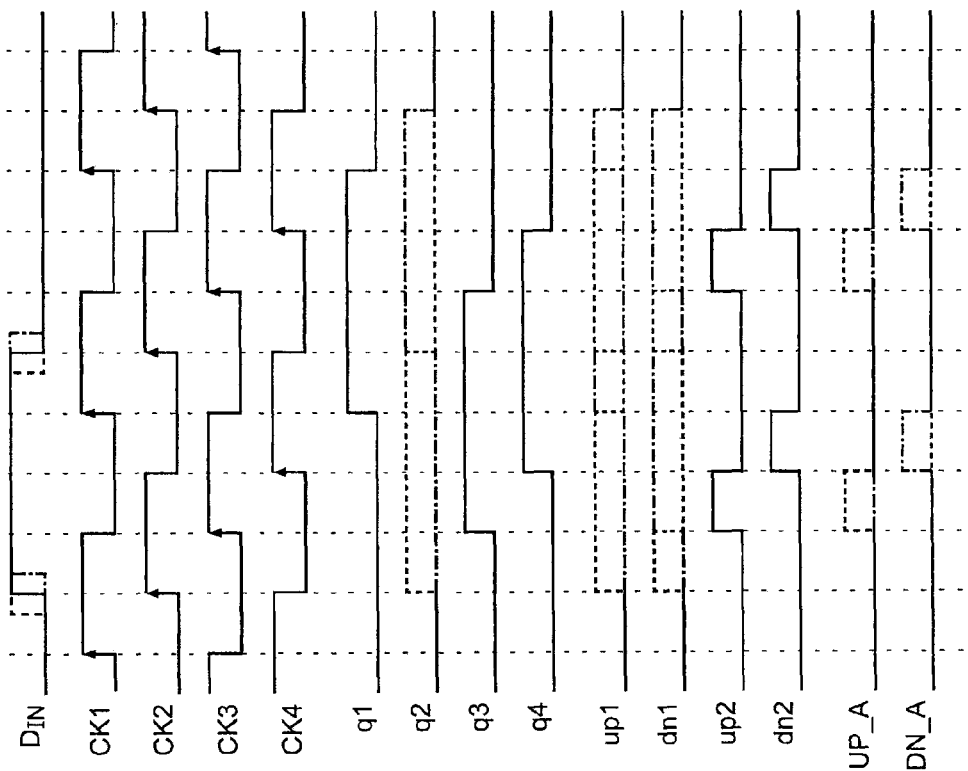
FIGS. 5A and 5B are time charts showing the operation of the phase comparator shown in FIG. 3.
Figure 5B:
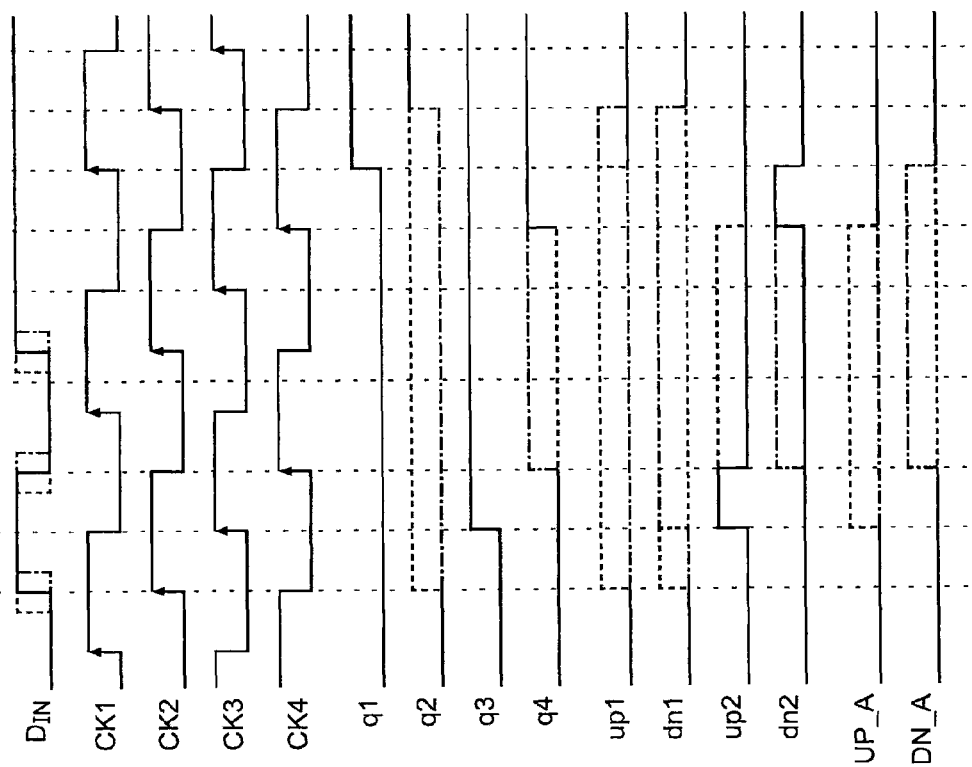

The above is the configuration of the phase comparator 10. Next, description will be made regarding the phase comparator 10. FIGS. 4A and 4B and FIGS. 5A and 5B are time charts showing the operation of the phase comparator 10 shown in FIG. 3. FIGS. 4A and 4B show the operation when the input data $D_{IN}$ transits once, and when the input data $D_{IN}$ consecutively transits twice, respectively. FIGS. 5A and 5B show the operation when the input data consecutively transits three times, and when the input data non-consecutively transits twice, respectively.

As shown in FIG. 4A, when the input data $D_{IN}$ transits once, if the phase of the input data $D_{IN}$ is advanced, an up signal UP_A one segment in length (one-quarter the period of the clock signal) is generated. Conversely, if the phase of the input data $D_{IN}$ is delayed, a down signal DN_A one segment in length (one-quarter the period of the clock signal) is generated.

Referring to FIG. 4B, when the input data $D_{IN}$ consecutively transits twice, if the phase of the input data $D_{IN}$ is advanced, an up signal UP_A three segments in length (three-quarters the period of the clock signal) is generated. Conversely, if the phase of the input data $D_{IN}$ is delayed, a down signal DN_A three segments in length (three-quarters the period of the clock signal) is generated.

Referring to FIG. 5A, when the input data $D_{IN}$ consecutively transits three times, if the phase of the input data $D_{IN}$ is advanced, an up signal UP_A five segments in length (five-quarters the period of the clock signal) is generated. Conversely, if the phase of the input data $D_{IN}$ is delayed, a down signal DN_A five segments in length (five-quarters the period of the clock signal) is generated.

Referring to FIG. 5B, when the input data $D_{IN}$ non-consecutively transits, such an arrangement twice repeats performing the same operation as that performed when the input data $D_{IN}$ transits once, as shown in FIG. 4A.

As described above, the phase comparator 10 according to the embodiment is capable of generating the up signal UP_A and the down signal DN_A which are asserted for a period that corresponds to the number of times the input data $D_{IN}$ consecutively transits.

Furthermore, in the steps for generating the up signal UP_A and the down signal DN_A, the phase comparator 10 operates without timing synchronization, thereby having the advantage of little delay. Thus, such an arrangement allows the phase of the clock signal to be adjusted according to the change of the input data $D_{IN}$ at a high response speed.

Moreover, the minimum length of the assert period of the down signal DN and the up signal UP is a single interval (one-quarter the period of the clock signal, which corresponds to a 90° phase), which is also the advantage of the phase comparator 10 shown in FIG. 3. That is to say, such a small minimum period of the down signal DN_A and the up signal UP_A provides an improved degree of freedom in the design of the charge pump circuit 40.

A typical charge pump circuit 40 includes a capacitor, a charging circuit configured to charge the capacitor according to the up signal UP, and a discharging circuit configured to discharge the capacitor according to the down signal DN. With such an arrangement, the voltage generated at the capacitor is output as the control voltage Vcnt1.

Accordingly, the amount of change ΔV in the control voltage Vcnt1 is represented by the Expression ΔV=τ×Ichg/C.

That is to say, the amount of change ΔV:
1) is proportional to the pulse width τ of the up signal UP and the down signal DN;
2) is proportional to the charging/discharging current Ichg; and
3) is inversely proportional to the capacitance C of the capacitor.

Accordingly, by providing a reduced pulse width, while providing the same amount of change ΔV in the control voltage Vcnt1, such an arrangement can provide an increased charging/discharging current Ichg or a small value of the capacitance C. That such an arrangement has a small capacitor C means that the circuit can be designed with a small circuit area, which is exceedingly useful in integrating the circuit. Furthermore, that such an arrangement is capable of generating the charging/discharging current Ichg having a large amplitude means that it provides the charging/discharging current Ichg with high precision, which is exceedingly useful in improving the precision of the operation for stabilizing the frequency of the CDR circuit 100.

Figure 6:
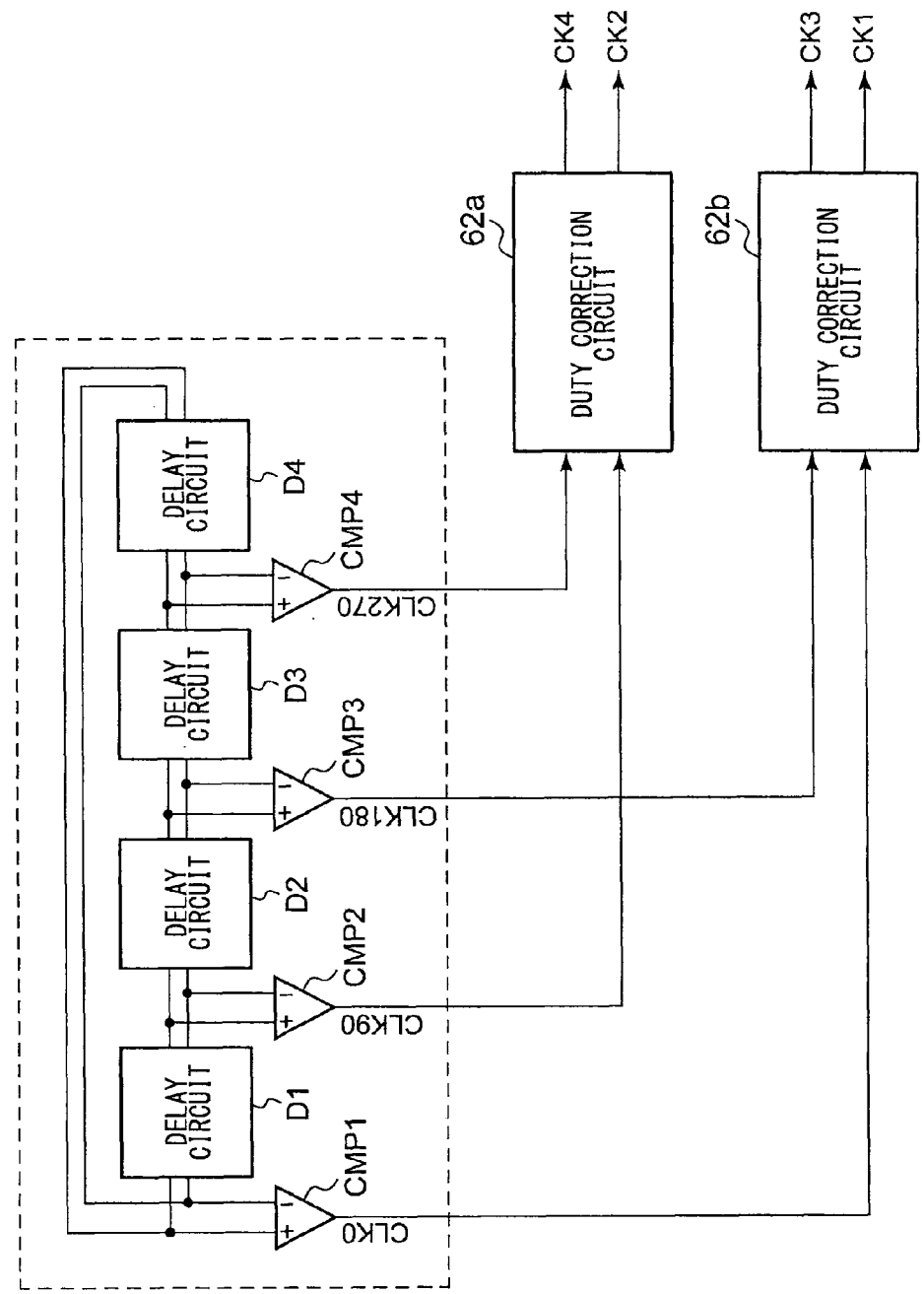
FIG. 6 is a circuit diagram which shows a configuration of a VCO shown in FIG. 1.

Next, description will be made regarding the configuration of the VCO 60 shown in FIG. 1. FIG. 6 is a circuit diagram which shows an example configuration of the VCO 60 shown in FIG. 1. The VCO 60 includes multiple differential delay circuits D1 through D4, multiple comparators CMP1 through CMP4, and two duty correction circuits 62a and 62b.

The multiple differential delay circuits D1 through D4 are connected in the form of a ring. The delay amount of each differential delay circuit is adjusted according to the control voltage Vcnt2.

The multiple comparators CMP1 through CMP4 are respectively provided to the multiple differential delay circuits D1 through D4. The comparators CMP1 through CMP4 convert the differential signals input to the corresponding differential delay circuits D1 through D4 into the single-ended internal clock signals CLK0, CLK90, CLK180, and CLK270.

The duty correction circuit 62a receives the pair of internal clock signals CLK0 and CLK180 that have phases shifted by 180 degrees from each other, corrects the internal clock signals thus received such that the duty ratio of each internal clock signal becomes 50%, and outputs the clock signals thus corrected. In the same way, the duty ratio correction circuit 62b receives the pair of internal clock signals CLK90 and CLK270 that have phases shifted by 180 degrees from each other, corrects the internal clock signals thus received such that the duty ratio of each internal clock signal becomes 50%, and outputs the clock signals thus corrected.

Figure 7A:
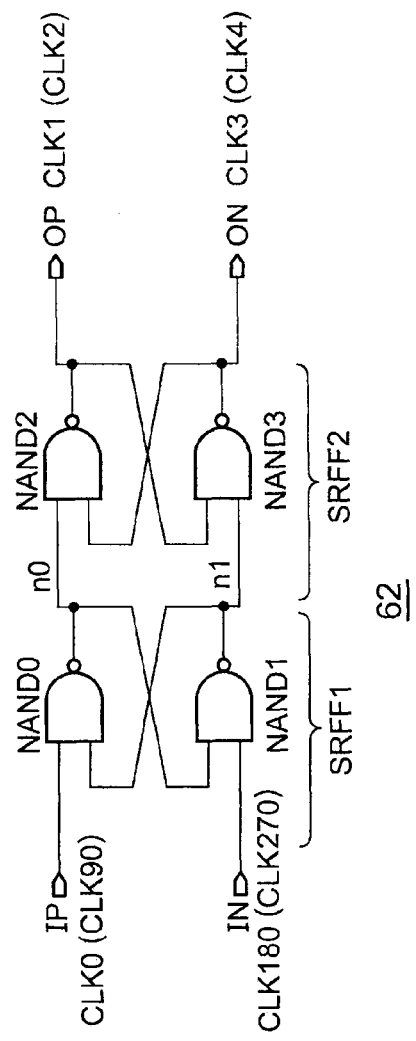
FIGS. 7A and 7B are circuit diagrams showing the configuration of a duty correction circuit.
Figure 7B:
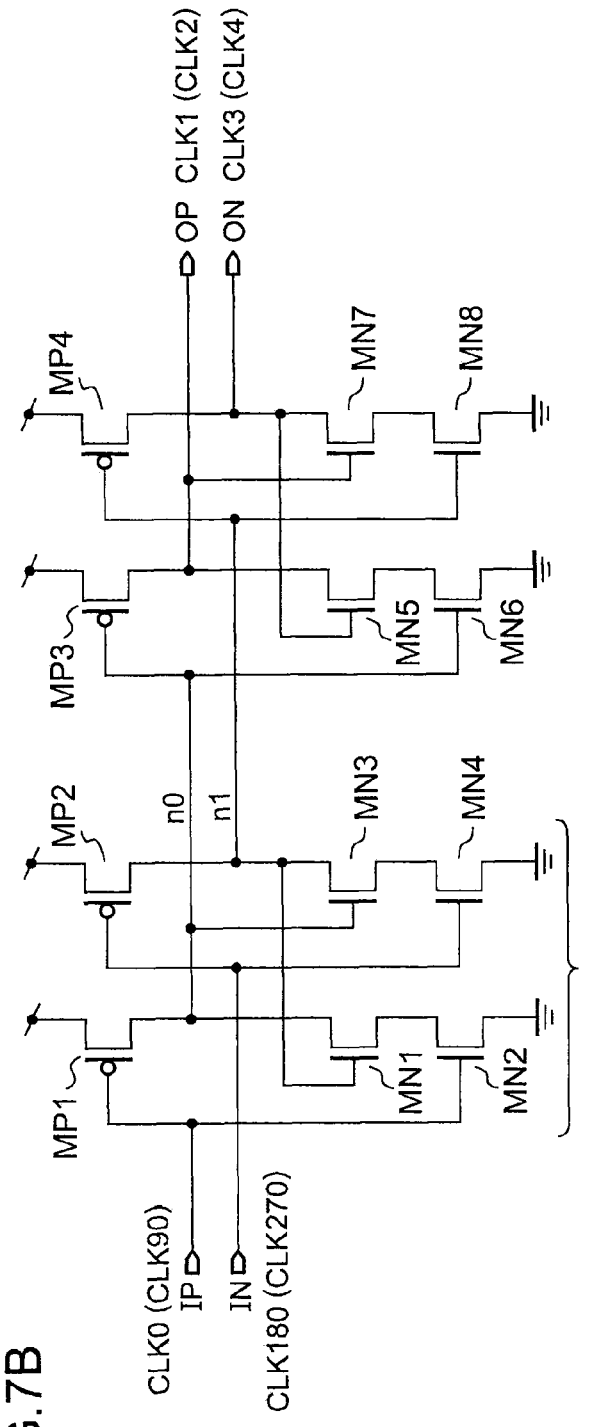

FIGS. 7A and 7b are circuit diagrams showing the configuration of the duty correction circuit 62.

The duty correction circuit 62 shown in FIG. 7A has a static circuit configuration employing NAND gates. The duty correction circuit 62 shown in FIG. 7A includes gates NAND0 through NAND3.

The pair of gates NAND0 and NAND1 and the pair of gates NAND2 and NAND3 each have a NAND-type SR flip-flop configuration. That is to say, the duty correction circuit 62 has a configuration in which two SR flip-flops SRFF1 and SRFF2 are cascade-connected.

Specifically, the internal clock CLK0 (CLK90), which is the one of a pair of internal clock signals CLK, is input to the first input terminal of the first gate NAND0. Furthermore, the internal clock CLK180 (CLK270), which is the other of the pair of internal clock signals, is input to the first input terminal of the second gate NAND1, and the second input terminal thereof is connected to the output terminal of the first gate NAND0. Moreover, the output terminal of the gate NAND0 is connected to the second input terminal of the NAND gate NAND1.

The first input terminal of the third gate NAND2 is connected to the output terminal of the first NAND gate NAND0. The first input terminal of the fourth gate NAND3 is connected to the output terminal of the second NAND gate NAND3. Furthermore, the second input terminal thereof is connected to the output terminal of the third gate NAND2, and the output terminal thereof is connected to the second input terminal of the third gate NAND2.

The duty correction circuit 62 shown in FIG. 7B has a dynamic-type circuit configuration. The duty correction circuit 62 shown in FIG. 7B includes a first PMOS transistor MP1 through a fourth PMOS transistor MP4, and a first NMOS transistor MN1 through an eighth NMOS transistor MN8.

The transistors MP1, MN1, and MN2 are connected in series in this order between the power supply terminal and the ground terminal. In the same way, a set of the transistors MP2, MN3, and MN4, a set of the transistors MP3, MN5, and MN6, and a set of the transistors MP4, MN7, and MN8 are each connected in series in this order between the power supply terminal and the ground terminal.

The internal clock signal CLK0 (CLK90) which is the one of the pair of the internal clock signals is input to the gates of the transistors MP1 and MN2. The internal clock CLK180 (CLK270) which is the other of the pair of the internal clock signals is input to the gates of the transistors MP2 and MN4. A connection node n0 that connects the transistors MP1 and MN1 is connected to the gates of the transistors MN3, MP3, and MN6. Furthermore, a connection node n1 that connects the transistor MP2 and the transistor MN3 is connected to the gates of the transistors MN1, MP4, and MN8.

The connection node that connects the transistors MP3 and MN5 is connected to the gate of the transistor MN7, and is connected to the output terminal OP which is the one of a pair of the output terminals of the duty correction circuit 62.

Furthermore, the connection node that connects the transistors MP4 and MN7 is connected to the gate of the transistor MN5, and is connected to the output terminal ON which is the other of the pair of the output terminals of the duty correction circuit 62.

Figure 8A:
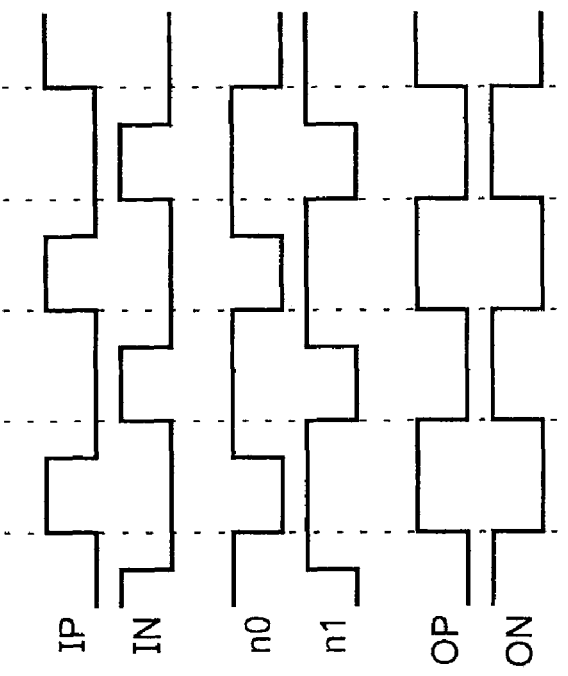
FIGS. 8A and 8B are time charts showing the operation of the duty correction circuit.
Figure 8B:
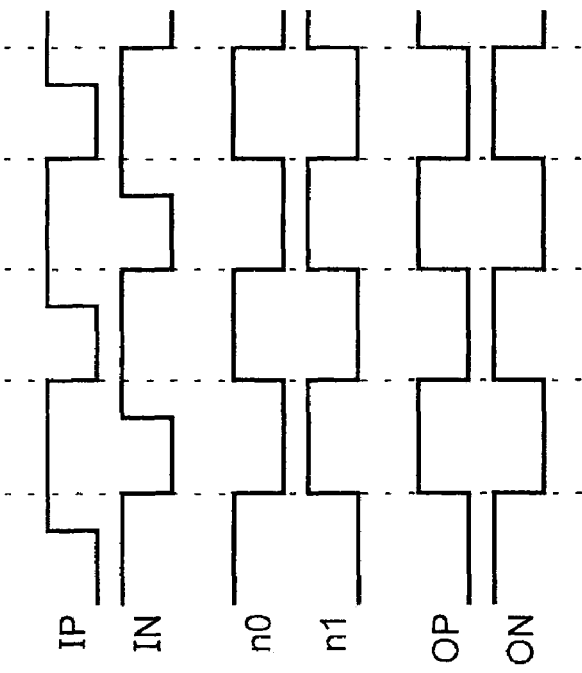

FIGS. 8A and 8B are time charts which show the operation of the duty correction circuit 62. FIG. 8A shows a case in which a pair of internal clock signals have an over-short high-level period (have a duty ratio lower than 50%). FIG. 8B shows a case in which a pair of internal clock signals have an over-long high-level period (have a duty ratio which is higher than 50%).

As shown in FIG. 8A, when the internal clock signals have an over-long high-level period, the pair of internal clock signals is inverted by the SR flip-flop SRFF1 provided as an upstream component, and the output signal of the SR flip-flop SRFF1 is latched by the SR flip-flop SRFF2 provided as a downstream component.

Conversely, when the internal clock signals have an over-short high-level period as shown in FIG. 8B, the pair of internal clock signals is latched by the SR flip-flop provided as an upstream component, and the output signal of the SR flip-flop SRFF1 is inverted by the SR flip-flop SRFF2 provided as a downstream component.

In both cases, the duty correction circuit 62 is capable of generating a clock signal having a duty ratio corrected to be 50%.

That is to say, by providing the duty correction circuit 62, such an arrangement is capable of supplying clock signals CK1 through CK4 having a duty ratio corrected to be 50% to the phase comparator 10 even if there is deviation in the duty ratio of the clock signals CLK0, CLK90, CLK180, and CLK270 generated by the differential delay circuits D1 through D4.

The positive edges of the clock signals CK1 and CK3 are used to determine the respective time points at which the aforementioned data $D_{OUT}1$ and $D_{OUT}2$ are to be acquired. That is to say, the duty ratio of the clock signals CK1 through CK4 is maintained at 50%. This stabilizes the timings of the positive edges of the clock signals CK1 and CK3, thereby allowing the data $D_{OUT}1$ and $D_{OUT}2$ to be acquired with high precision.

With the phase comparator 10 as described above, the phase control operation is performed for the clock signals CK1 through CK4 based upon the result of latching the input data $D_{IN}$ using the clock signals CK1 through CK4. Thus, by stabilizing the duty ratio of each of the clock signals CK1 through CK4 to be 50%, such an arrangement provides improved precision of the phase comparison operation of the phase comparator 10.

Description has been made in the embodiment regarding an arrangement configured to reproduce four-phase clock signals. Also, the technical concepts disclosed in the embodiment can be applied to an arrangement configured to reproduce eight-phase clock signals, sixteen-phase clock signals, or other clock signals, and such modifications are encompassed in the technical scope of the present invention, which can be clearly understood by those skilled in this art.

While the preferred embodiments of the present invention have been described using specific terms, such description is for illustrative purposes only, and it is to be understood that changes and variations may be made without departing from the spirit or scope of the appended claims.

What is claimed is:

1. A clock data recovery circuit comprising:
    a voltage controlled oscillator configured to generate multi-phase clock signals including a plurality of clock signals, each having a frequency that corresponds to an input control voltage, and having phases shifted from one another such that they are positioned at regular intervals;
    a phase comparator configured to compare the phase of input data with the respective phases of the plurality of clock signals, and to generate a phase difference signal, including an up signal and a down signal, which represents the comparison result; and
    a charge pump circuit configured to generate the control voltage such that, when the up signal of the phase difference signal is asserted, the frequency of the voltage controlled oscillator is raised, and when the down signal of the phase difference signal is asserted, the frequency of the voltage controlled oscillator is lowered,
    wherein the phase comparator comprises
        a plurality of flip-flops severally arranged for the plurality of clock signals, and each configured to latch the input data at a time point of a corresponding clock signal,
        a plurality of first logical gates severally arranged for the odd-numbered flip-flops, and configured such that the i-th (i represents an integer) first logical gate generates an internal up signal which is asserted when an output signal of the (2×i−1)-th flip-flop does not match an output signal of the (2×i)-th flip-flop,
        a plurality of second logical gates severally arranged for the even-numbered flip-flops, and configured such that the j-th (j represents an integer) second logical gate generates an internal down signal which is asserted when an output signal of the (2×j)-th flip-flop does not match an output signal of the (2×j+1)-th flip-flop,
        a third logical gate configured to generate the up signal based upon the plurality of internal up signals generated by the plurality of first logical gates, and
        a fourth logical gate configured to generate the down signal based upon the plurality of internal down signals generated by the plurality of second logical gates.

2. A clock data recovery circuit according to claim 1, wherein, when all the internal up signals are asserted, the third logical gate asserts the up signal,
    and wherein, when all the internal down signal are asserted, the fourth logical gate asserts the down signal.

3. A clock data recovery circuit according to claim 1, wherein the plurality of clock signals are configured as four-phase clock signals.

4. A clock data recovery circuit according to claim 2, wherein the plurality of clock signals are configured as four-phase clock signals.

5. A clock data recovery circuit according to claim 1, wherein the plurality of first logical gates and the plurality of second logical gates are each configured as an EOR (exclusive OR) gate,
    and wherein the third logical gate and the fourth logical gate are each configured as an AND (logical AND) gate.

6. A clock data recovery circuit according to claim 2, wherein the plurality of first logical gates and the plurality of second logical gates are each configured as an EOR (exclusive OR) gate,
    and wherein the third logical gate and the fourth logical gate are each configured as an AND (logical AND) gate.

7. A clock data recovery circuit according to claim 1, wherein the voltage controlled oscillator comprises:
    a plurality of differential delay circuits connected in the form of a ring, and each configured such that the delay amount is adjusted according to the control voltage;
    a plurality of comparators severally arranged for the plurality of differential delay circuits, and each configured to convert a corresponding input differential signal into a single-ended internal clock signal; and
    a duty correction circuit configured to receive a pair of internal clock signals having phases that are shifted by 180 degrees from one another, to correct the duty ratio of each internal clock signal, and to output the pair of internal clock signals thus corrected.

8. A clock data recovery circuit according to claim 2, wherein the voltage controlled oscillator comprises:
    a plurality of differential delay circuits connected in the form of a ring, and each configured such that the delay amount is adjusted according to the control voltage;
    a plurality of comparators severally arranged for the plurality of differential delay circuits, and each configured to convert a corresponding input differential signal into a single-ended internal clock signal; and
    a duty correction circuit configured to receive a pair of internal clock signals having phases that are shifted by 180 degrees from one another, to correct the duty ratio of each internal clock signal, and to output the pair of internal clock signals thus corrected.

9. A clock data recovery circuit according to claim 7, wherein the duty correction circuit comprises:
    a first NAND (logical NAND) gate arranged such that the one of a pair of internal clock signals is input to a first input terminal thereof;

a second NAND gate arranged such that the other of the pair of internal clock signals is input to a first input terminal thereof, a second input terminal thereof is connected to an output terminal of the first NAND gate, and an output terminal thereof is connected to a second input terminal of the first NAND gate;

a third NAND gate arranged such that a first input terminal thereof is connected to the output terminal of the first NAND gate; and a fourth NAND gate arranged such that a first input terminal thereof is connected to the output terminal of the second NAND gate, a second input terminal thereof is connected to an output terminal of the third NAND gate, and an output terminal thereof is connected to a second input terminal of the third NAND gate.

10. A clock data recovery circuit according to claim 7, wherein the duty correction circuit comprises:

a first PMOS (P-channel Metal Oxide Semiconductor) transistor, a first NMOS (N-channel Metal Oxide Semiconductor transistor), and a second NMOS transistor connected in series between a power supply terminal and a ground terminal;

a second PMOS transistor, a third NMOS transistor, and a fourth NMOS transistor connected in series between the power supply terminal and the ground terminal;

a third PMOS transistor, a fifth NMOS transistor, and a sixth NMOS transistor connected in series between the power supply terminal and the ground terminal; and a fourth PMOS transistor, a seventh NMOS transistor, and an eighth NMOS transistor connected in series between the power supply terminal and the ground terminal, wherein one of the pair of internal clock signals is input to the gates of the first PMOS transistor and the second NMOS transistor, and wherein the other of the pair of internal clock signals is input to the gates of the second PMOS transistor and the fourth NMOS transistor, and wherein a connection node that connects the first PMOS transistor and the first NMOS transistor is connected to the gates of the third NMOS transistor, the third PMOS transistor, and the sixth NMOS transistor, and wherein a connection node that connects the second PMOS transistor and the third NMOS transistor is connected to the gates of the first NMOS transistor, the fourth PMOS transistor, and the eighth NMOS transistor, and wherein a connection node that connects the third PMOS transistor and the fifth NMOS transistor is connected to a gate of the seventh NMOS transistor and one of output terminals of the duty correction circuit, and wherein a connection node that connects the fourth PMOS transistor and the seventh NMOS transistor is connected to a gate of the fifth NMOS transistor and the other of the output terminals of the duty correction circuit.

11. A clock data recovery circuit according to claim 1, further comprising a phase locked loop including the phase comparator, and configured to adjust the respective phases of the plurality of clock signals according to the phase of the input data; and a frequency locked loop configured to adjust the frequency of the multi-phase clock signals according to the frequency of the input data.

12. A clock data recovery circuit according to claim 11, further comprising:

a frequency comparator configured to receive a reference signal generated by making a comparison between differential input data and a signal generated by making a comparison between two clock signals that are included in the multi-phase clock signals and that have phases shifted by 180 degrees from one another, and to generate a phase frequency difference signal including an up signal an a down signal each of which is asserted according to the phase difference between the signals thus received; and a selector configured to receive the phase difference signal and the phase frequency difference signal, and to select one from among the signals thus received, wherein, when the selector selects the phase difference signal, the phase locked loop is set to an active state, and wherein, when the selector selects the phase frequency difference signal, the frequency locked loop is set to an active state, and a feedback control operation is performed for the frequencies and phases of the multi-phase clock signals such that the interval between two clock signals having phases shifted by 180 degrees from one another matches the period of the input data.

13. A clock data recovery circuit according to claim 2, further comprising:

a first buffer configured to receive an output signal of a first flip-flop, which is configured to receive a first clock signal and which is selected from among the plurality of flip-flops; and a second buffer configured to receive an output signal of a different flip-flop, which is configured to receive a different clock signal having a phase shifted by 180 degrees from that of the first clock signal, and which is selected from among the plurality of flip-flops, and to output the signal thus received as second data.

14. A clock data recovery circuit according to claim 7, wherein the duty correction circuit is configured to correct the duty ratio of the pair of internal clock signals having phases shifted by 180 degrees from one another to be 50%, and to output the pair of internal clock signals thus corrected.

* * * * *